(12) United States Patent
Oosaka

(10) Patent No.: US 7,105,447 B2
(45) Date of Patent: Sep. 12, 2006

(54) ETCHING METHOD

(75) Inventor: Tsutomu Oosaka, Kanagawa (JP)

(73) Assignee: Sony Corporation, (JP)

( * ) Notice: Subject to any disclaimer, the term of this patent is extended or adjusted under 35 U.S.C. 154(b) by 0 days.

(21) Appl. No.: 10/979,249

(22) Filed: Nov. 3, 2004

(65) Prior Publication Data

US 2005/0106892 A1 May 19, 2005

(30) Foreign Application Priority Data

Nov. 14, 2003 (JP) ............................ P2003-384657

(51) Int. Cl.
*H01L 21/302* (2006.01)
*H01L 21/311* (2006.01)

(52) U.S. Cl. ........................ 438/689; 438/704; 438/745

(58) Field of Classification Search ................ 438/689, 438/704, 745, 706, 733, 734, 738, 739, 905, 438/913
See application file for complete search history.

(56) References Cited

U.S. PATENT DOCUMENTS

| | | | | |
|---|---|---|---|---|
| 5,213,658 A | * | 5/1993 | Ishida | ........................ 216/67 |
| 5,246,532 A | * | 9/1993 | Ishida | .................... 156/345.46 |
| 5,474,649 A | * | 12/1995 | Kava et al. | .................. 438/729 |
| 5,662,772 A | | 9/1997 | Scheiter et al. | |
| 6,162,367 A | | 12/2000 | Tai et al. | |
| 2003/0124462 A1 | | 7/2003 | Miller | |

FOREIGN PATENT DOCUMENTS

| | | |
|---|---|---|
| EP | 0 822 584 A2 | 2/1998 |
| EP | 1 081 093 A2 | 3/2001 |
| JP | 2002-214548 | 7/2002 |
| WO | WO-01/87766 A2 | 11/2001 |
| WO | WO-2005/035090 | 4/2005 |

OTHER PUBLICATIONS

Chang F. I., et al., "Gas-phase silicon micromachining with xenon difluoride", Proceedings of the Spie, Microelectronic Structures and Microelectromechanical Devices for Optical Processing and Multimedia Applications, Oct. 24, 1995, Austin, TX, USA, vol. 2641, 1995, pp. 117-128.

\* cited by examiner

*Primary Examiner*—David Nhu
(74) *Attorney, Agent, or Firm*—Rader, Fisherman, & Grauer PLLC; Ronald P. Kananen

(57) ABSTRACT

To provide an etching method capable of forming a cavity portion having a large space portion or a complicated structure by etching a sacrifice layer through a very fine etching opening at favorable accuracy in configuration. An etching process of a object is carried out by exposing the object to a processing fluid containing etching reaction seed (the third step S3, the fourth step S4), and then, the pressure in the processing chamber is reduced to make a density of the processing fluid around the object lower than that in the fourth step S4 (the first step S1). While the first step S1 to the first step S4 are repeated, in the third step S3 and the fourth step S4 executed after the first step S1, the processing fluid containing etching reaction seed is newly supplied to the processing atmosphere in which the object is placed to make the density of the processing fluid around the object higher than that in the first step S1.

3 Claims, 4 Drawing Sheets

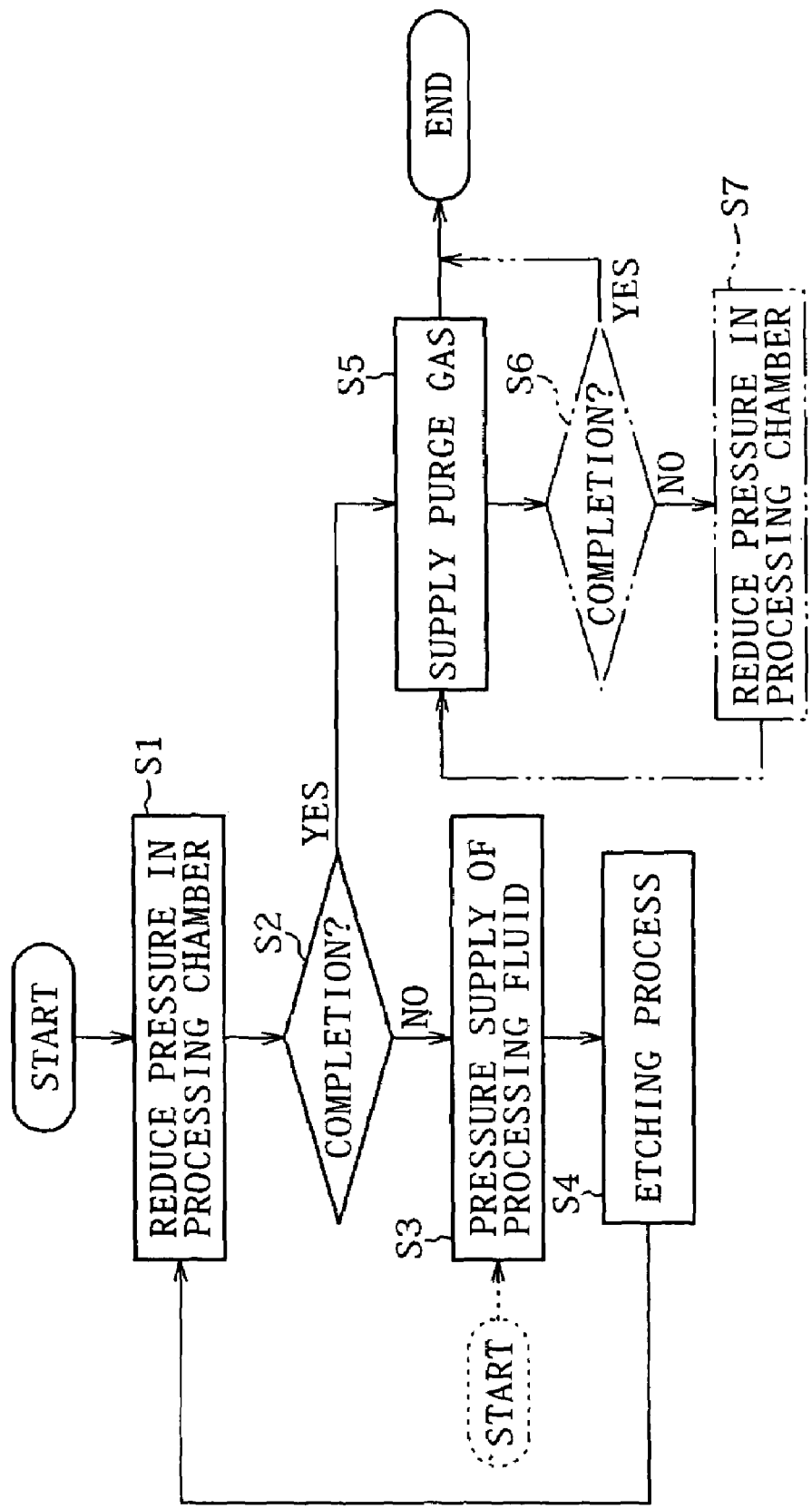

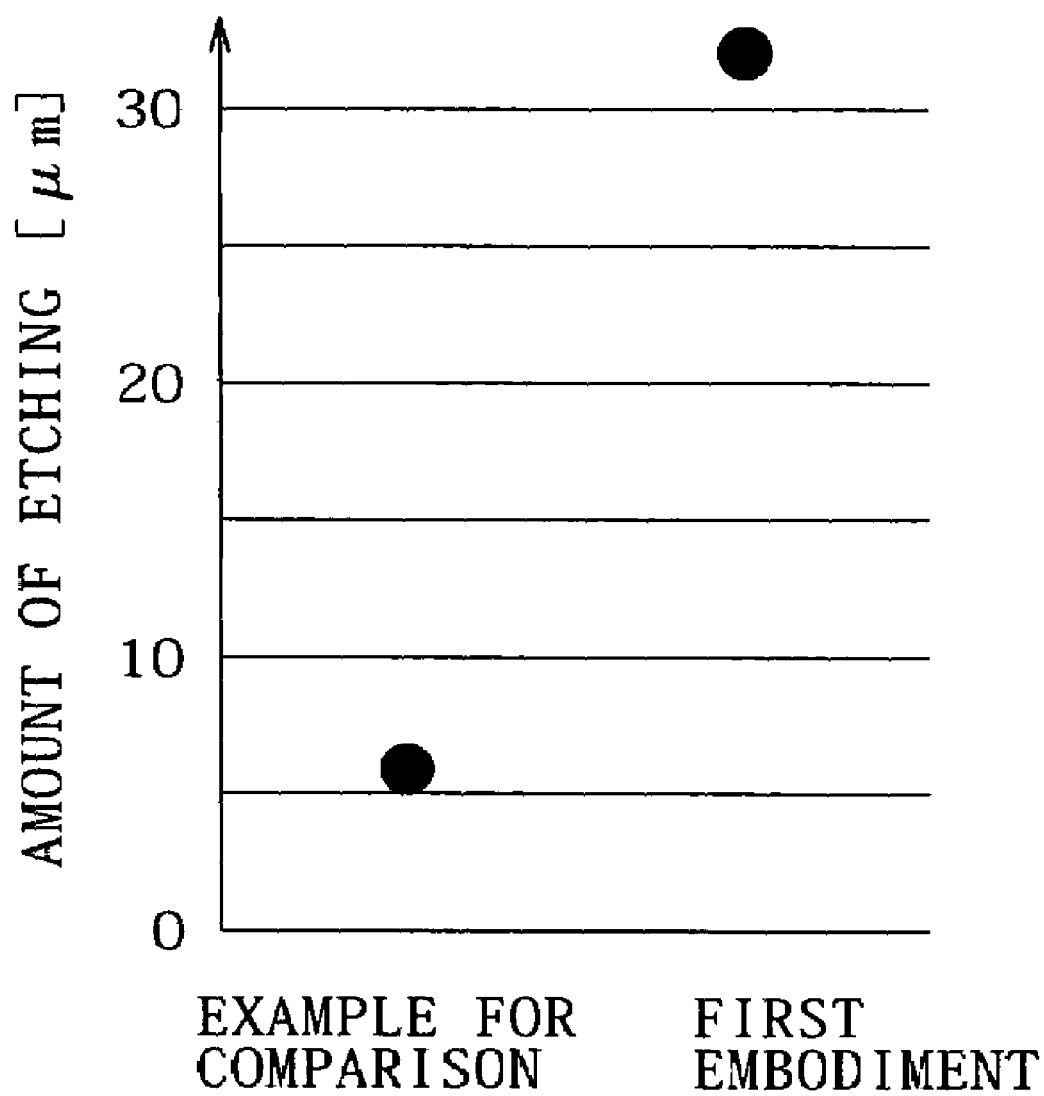

ETCHING METHOD

CROSS REFERENCES TO RELATED APPLICATIONS

The present document is based on Japanese Priority Document JP2003-384657, filed to the Japanese Patent Office on Nov. 14, 2003, the entire contents of which being incorporated herein by reference to the extent granted by law.

BACKGROUND OF THE INVENTION

1. Field of the Invention

The present invention relates to an etching method and particularly to an etching method applicable to the case that a cavity portion to form is larger than a size of an etching opening or the case that a cavity portion having a complicated structure is formed when a microstructure having a cavity portion is formed in production of a semiconductor apparatus or a micromachine.

2. Related Art

With development of microstructure technologies, micro-machines (Micro Electro Mechanical Systems: MEMS) and small devices including a micromachine have attracted attention. The micromachine is an element in which a movable portion comprising a three-dimensional structure formed on a substrate, such as a silicon substrate and a glass substrate, and a semiconductor integrated circuit or the like for control of driving the movable portion are electrically, mechanically combined.

Conventionally, as a technology for providing the three dimensional structure, in such a micromachine field, a three-dimensional structure having a cavity portion under a patterned structure layer is provided by previously forming a sacrifice layer on a substrate, forming a structural member layer on this sacrifice layer which is patterned, and then selectively removing the sacrifice layer. As the sacrifice layer, silicon dioxide ($SiO_2$) or silicon (Si) is used.

If the sacrifice layer is formed with silicon dioxide, an etching liquid of Fluorine (F) type is used as an etchant and if the sacrifice layer is formed with silicon, an etching gas such as Xenon fluoride ($XeF_2$), and bromine fluoride ($BrF_3$) is used as an etchant, for example in Japanese laid-open patent application No. 2002-214548, particularly paragraphs 0002 and 0030.

For example, if a three-dimensional structure is formed having a structure as shown in FIG. 1, first, a sacrifice layer 2 is buried in a hollow portion 1a formed on the surface side of the substrate 1 and a structural member layer 3 is formed to cover the substrate 1 and the sacrifice layer 2. Next, the structural member layer 3 is patterned to have a required configuration as well as an etching opening 3a reachable the sacrifice layer 2 is formed in the structural member layer 3. After that, the sacrifice layer 2 is removed by etching through the etching opening 3a. This forms a cavity portion "a" under the structural member layer 3. This forms a cavity portion "a" under the structural member layer 3. Here in this etching, as described above, a suitable etchant is selected in accordance with the material forming the sacrifice layer.

SUMMARY OF THE INVENTION

However, in such a method of forming a three dimensional structure, there is a problem as follows.

For example, in forming the three-dimensional structure described with reference to FIG. 1, if the cavity portion "a" formed by etching is extremely larger than the etching opening 3a, it is difficult to completely remove the sacrifice layer 2 by etching.

This is caused by the following mechanism of etching. As the cavity portion "a" is formed as etching advances in the sacrifice layer 2, the etchant enters the formed cavity portion "a". On the other hand, as advance of the etching, etching reaction seed contained in the etchant decreases, while reaction products increase. However, in the case that the etching opening 3a is very fine, when the etching opening is broadened to a certain extent, the substitution efficiency within the cavity portion "a" decreases. Thus, if the cavity portion "a" becomes larger than the cross section of the etching opening 3a, an etching rate of the sacrifice layer 2 extremely decreases.

Such a phenomenon cannot be completely prevented though a flow of etchant around the etching opening part is made faster, for example, by a spin system process to increase the substitution efficiency. Further, in the case that a gas is used as etchant, though the extent is rather low, the same phenomenon occurs.

Further, such a similar phenomenon occurs when, as shown in FIG. 2A, a cavity portion "a" having a narrow cap interposed (sandwiched) between the substrate 1 and the structural member layer 3 and when, as shown in FIG. 2B, a cavity portion "a" is formed which has a complicated configuration in comparison with the narrow etching opening 3a.

Still further, in manufacturing micro-machines having a three-dimensional structural member having such a cavity portion, it is desirable to etch the sacrifice layer at a process as close to the final process as possible to prevent destruction of the cavity portion during the process. For example, as shown in FIG. 2C, if a interconnect layer 5 is formed in an upper layer than the cavity portion "a" forming the-three-dimensional structural member, the interconnect layer 5 is buried with an insulation membrane 6 after the formation of the interconnect layer 5, and then an etching opening 3a reachable a sacrifice layer (not shown) is formed in this insulation membrane 6, wherein the sacrifice layer is removed by etching using the etching opening 3a to form a cavity portion "a". However, as the process approaches the final process, the etching opening 3a becomes deeper, the substitution efficiency of the etchant in the cavity portion "a" decreases, so that the sacrifice layer cannot be easily removed similarly to the case mentioned above.

Then, as described above, due to the fact that the sacrifice layers are completely removed by etching, the accuracy of formation of the cavity portion "a" decreases. This may cause deterioration in an operation characteristic of the micromachine having this cavity portion "a".

Further, because such a problem similarly occurs in the formation of a special interconnect to suppress interference between electric interconnects, in a semiconductor device having special interconnects, it also may cause deterioration of its operation characteristics.

Then, the present invention aims to provide an etching method that can sufficiently remove the sacrifice layer through a very fine etching opening, which enables preferable formation of a large cavity portion, a spatial portion having a complicated structure at a preferable accuracy in formation of configuration.

An etching method according to a preferred embodiment of the present invention is proposed, to repeatedly-execute the following first and second processes. In the first process, a object is subject to an etching process by exposing the object is to a processing fluid containing etching reaction seed. In the second process, a density of the processing fluid around the object is made lower than that in the first process. The repeated first and second processes, it is characterized in that in the first process after the second process, the processing fluid containing the etching reaction seed is newly supplied to a processing atmosphere in which the object is arranged as well as the density of the processing fluid adjacent to the object is made greater than that of the second process.

Here, if the processing fluid comprises a gas or a supercritical fluid, variation in the density of the processing fluid between the first and second processes may be conducted by pressure control of the processing atmosphere. Further, if the processing fluid is a gas, a supercritical fluid, or a liquid, the variation in the density of the processing fluid may be conducted by controlling the temperature of the processing fluid.

In the above-mentioned etching method, the second process for lowering the density of the processing fluid around the object is carried out between in the first processes for etching, so that the processing fluid that contributed to etching in the previous first process is compulsorily discharged around the object in the following second process. Thus, though the object has a cavity portion, a part or almost all of the processing fluid within the cavity portion is discharged. In the following first process, the processing fluid containing the etching reaction seed is newly supplied and the density of the processing fluid is increased around the object, so that a fresh processing fluid containing the etching reaction seed is also introduced into the above-mentioned cavity portion in which the processing fluid is substituted. Thus, repeating these processes results in maintaining intermittent supply of the processing fluid containing the etching reaction seed of which activity to the object has not been lost, into the cavity portion of the object. Thus, the etching rate can be maintained within the cavity portion.

Thus, the etching method of the present invention provides etching with a very fine etching opening, capable of formation of a cavity portion having a complicated configuration or a cavity portion which is large in comparison with an etching opening with a high accuracy in configuration without remaining of etching. As the result, for example, it is possible to improve operation characteristics of micromachines or semiconductor devices having a three-dimensional structural member with a cavity portion.

BRIEF DESCRIPTION OF THE DRAWINGS

The above and other objects, features and advantages of the present invention will become more apparent from the following description of the presently preferred exemplary embodiments of the invention taken in conjunction with the accompanying drawings, in which:

FIG. 4 illustrates a flow chart describing the etching method according to a preferred embodiment of the present invention; and FIG. 5 is a graphical drawing illustrating an advantage of the first preferred embodiment of the present invention together with an example for comparison.

DETAILED DESCRIPTION OF THE PREFERRED EMBODIMENTS

Herein below preferred embodiments will be described of an etching method of according to the present invention. Here, an etching method will be explained which is suitable for selectively removing a sacrifice layer having a larger volume or a complicated structure by etching through a very fine etching opening. Prior to describing embodiments of the etching method, an example of structure of a processing apparatus preferably used in the etching apparatus will be described.

<Processing Apparatus>

Figure 3:
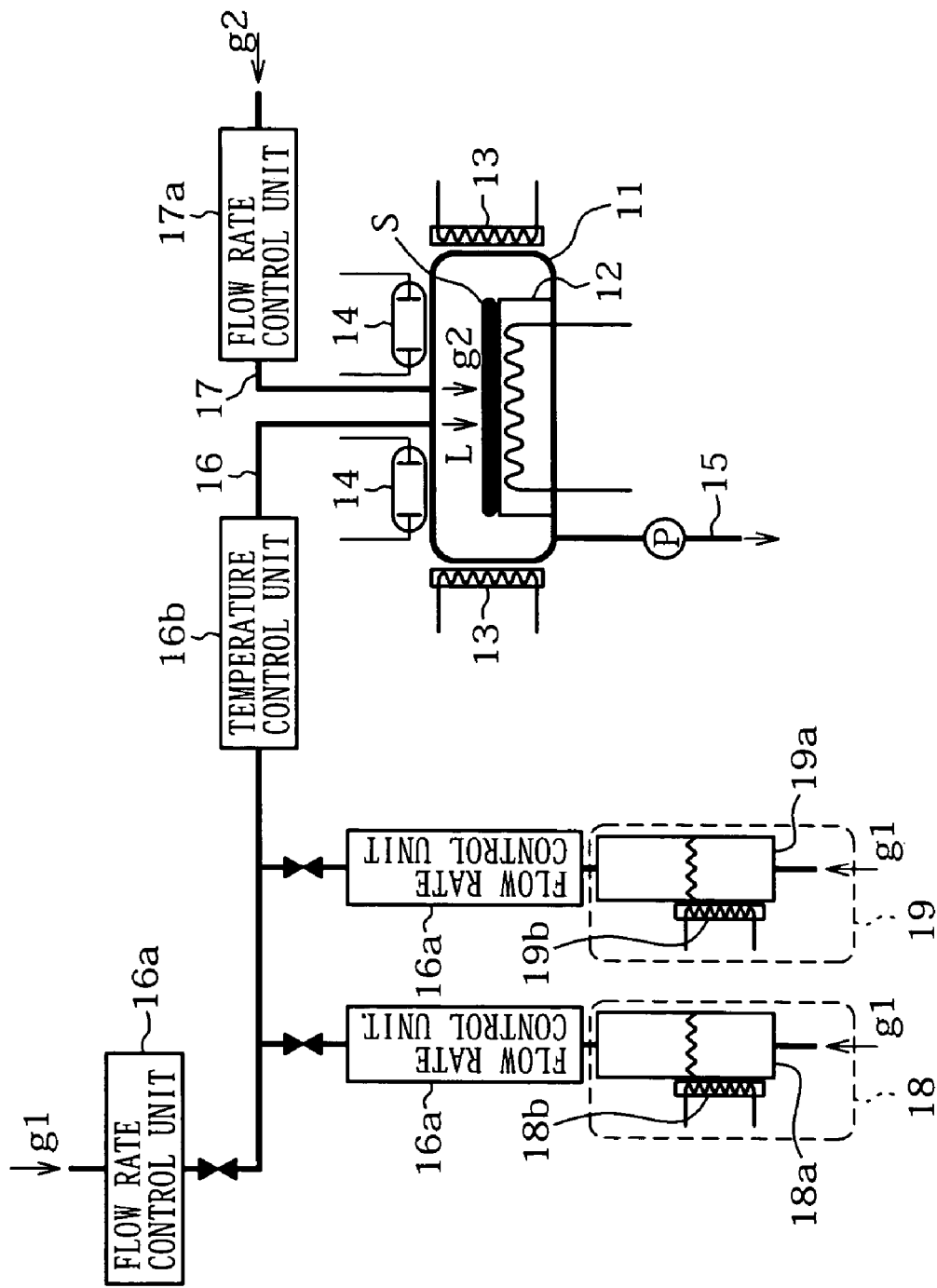
FIG. 3 is a structural drawing of a processing apparatus used for an etching method according to a preferred embodiment of the present invention.

FIG. 3 is an outline structural drawing illustrating an example of a processing apparatus used in the etching method according to a preferred embodiment of the present invention. This processing apparatus has a processing chamber 11 in which etching is carried out. Within the processing chamber 11, a stage 12 with a temperature control function is contained for retaining a wafer-like processing object S at a predetermined temperature by heating or cooling. Further, at an outer circumference of the processing chamber 11, a temperature adjusting unit 13 for preventing a processing fluid from excessively sticking to or being dewed on the inner wall of the processing chamber 11 or and lamps 14 for heating the object S on the stage 12. Further, an exhaust tube 15 having an exhaust pump P, a processing fluid supply tube 16 provided with a flow rate control unit 16a and a temperature control unit 16b, and a purge gas supply tube 17 provided with a flow rate control unit 17a are connected to the processing chamber 11 to keep the inside of the processing chamber 11 at a predetermined pressure atmosphere. Out of them the processing fluid supply tube 16 is connected to a cylinder (not shown) containing an inactive gas (including $N_2$ and $CO_2$, here), a hydrofluoric acid vapor generation unit 18 and a water vapor generation unit 19 through three flow rate control units 16a. These hydrofluoric acid vapor generation unit 18 and water vapor generation unit 19 generate hydrofluoric acid vapor and water vapor by bubbling inactive gas g1 in hydrofluoric acid anhydrate and pure water reserved tanks 18a and 19a and have temperature control units 18b and 19b, respectively. Further, though an illustration is omitted here, within the processing chamber 11, to evenly supply a fluid (gas or the like) supplied within the processing chamber 11 over the object S on the stage 12 and in order to be evenly discharged, a baffle or a rectifying mechanism may be provided. Further, functions for oscillating, rotating, and vibrating the object S and a mechanism (including a circulating unit) for stirring the processing fluid within the processing chamber 1 may be added.

According to the processing apparatus as mentioned above, it is possible to supply, through a processing fluid supply tube 16 into processing chamber 11, the processing fluid L in which hydrofluoric acid vapor with vapor is dispersed in the inactive gas g1 at a predetermined concentration and of which temperature is controlled by the temperature control unit 16b to a predetermined temperature. In this processing fluid L, hydrofluoric acid dissociated by a small amount of water acts as etching reaction seed for a silicon oxidation film. Further, when $N_2$ is supplied as the inactive gas g1, suitably controlling a temperature and a pressure thereof makes $N_2$ a supercritical fluid. Then, it is also possible to supply the processing fluid L in which fluorine vapor or water vapor is dispersed in this supercritical fluid at a predetermined concentration to the inside of the processing chamber L. Further, the inside of the processing chamber 11 is controlled to a predetermined temperature by the temperature control unit 13 as well as the pressure of the processing fluid L is controlled at a predetermined pressure by adjusting discharge through the exhaust tube 15 and a supply rate of the processing fluid L through the processing fluid supply tube 16. Thus, if a supercritical fluid is used as the processing fluid L, adjusting the temperature and the pressure within the processing chamber 11 keeps $N_2$ in the supercritical fluid condition within the processing chamber 11.

Here, the structure of the processing apparatus mentioned above is only an example, and thus, the gas (vapor) supplied from the processing fluid supply tube 16 is occasionally changed in accordance with the material used as the processing fluid L.

<Etching Method>

Next, the etching method for an object S with the processing apparatus having the structure mentioned above will be described on the basis of the flow chart shown in FIG. 4 with reference to FIG. 3. Here, an embodiment of the etching method will be described with an example in which on a surface side of the object S, a sacrifice layer made of silicon dioxide is selectively removed by etching through a very fine etching opening.

First, in the first step S1, the object S is placed on and fixed to the stage 12 within the processing chamber 11, which is tightly closed, and the inside of the processing chamber is discharged to reduce the pressure. Here, the gas in the inside of the processing chamber 11 is discharged to a pressure that is lower than that at the following etching process. Further, the atmosphere when the object S is put into the processing chamber 11 is selected in accordance with requirement such as the air or nitrogen gas. Further, the object S is heated or cooled to a predetermined temperature, according to the needs.

Next, in the second step S2, it is judged whether the etching process has completed. If the etching process has not completed (No), processing proceeds to the third step S3.

In the third step S3, the processing fluid L is supplied to the processing chamber 11 in a pressure-decreased condition through the processing fluid supply tube 16 to fill the inside of the processing chamber 11 with the processing fluid L. During this, the processing fluid L, for example, provided by doping water vapor at a predetermined flow rate generated by water vapor generation unit 19 with hydrofluoric acid vapor at a predetermined flow rate generated by hydrofluoric acid vapor generation unit 18, is controlled to have a predetermined temperature by the temperature control unit 16b and supplied to the processing chamber 11. During this, the pressure of the processing chamber 11 is not specially limited as long as it is higher than that in the first step S1. That is, it maybe larger than, about the same, or lower than the atmospheric pressure. However, it is more desirable that the difference of pressure from the first step S1 is larger.

Instead of mixture of hydrofluoric acid vapor with water vapor, as the processing fluid L, evaporation gas at azeotropic concentration from a hydrofluoric acid solution can be used. Further, inactive gas g1 with a predetermined flow rate may be doped for dilution. Further, depending on a method of forming a film of silicon dioxide providing the sacrifice layer, the sacrifice layer may contain much moisture therein. In that case, only hydrofluoric acid anhydrate is supplied as the processing fluid L.

Further, in the fourth step S4, the inside of the processing chamber 11 is filled with the above-mentioned processing fluid L having a predetermined pressure to carry out etching in this condition for a predetermined interval. During this, it is preferable to generate ventilating currents by maintaining the supply of the processing fluid L into the processing chamber 11 and discharging. Further, the time interval of the etching processing in the fourth step S4 is determined such that the etching rate is kept at a predetermined level. Further, because etching advances in the stage of the third step S3, the etching time process may be a total of those in the third and fourth steps S3 and S4. Further, the time interval of the etching processing varies in accordance with a concentration of the etching reaction seed (here, hydrofluoric acid dissociated by a very small amount of water) in the processing fluid L, a pressure in the processing chamber 11, a temperature, a type of the sacrifice layer as the target of etching, and a configuration of a cavity portion formed by etching. Thus, it is preferable to previously determine the time interval through estimation.

Above-mentioned third step S3 and fourth step S4 constitute an example of preferred embodiment of a first process according to the present invention. Next, in the fourth step S4, after elapse of a predetermined etching processing time interval, supply of the processing fluid into the processing chamber 11 is stopped and processing returns to the first step S1.

In the following first step S1, the pressure in the processing chamber 11 is reduced to a pressure lower than that in the fourth step S4. This decreases the density of the processing fluid L in the processing chamber 11 to a density lower than that in the fourth step S4. Further, the pressure in the processing chamber 11 in the first step S1 is preferably set a further lower pressure in consideration of a capacity of the discharging pump P and efficiency if a discharging speed is maintained to such an extent that the cavity portion formed by etching is not destroyed. Further in the first step S1, to vaporize the reaction production generated in the etching process (for example, water or low vaporized material) in the fourth step S4 and to prevent the structure from destroying due to tensile force in etching residue or liquids it can be maintained for a predetermined interval under a decreased pressure. The above-mentioned first step S1 corresponds to an example of preferred embodiment for a second process of the present invention.

Hereinafter, the process from the first step S1 to the fourth step S4 is repeated until a predetermined number of times of the etching process has completed in the second step S2. The number of times of repetition is set such that the sacrifice layer within a cavity portion formed in the object S is totally removed.

Further, in this repetition, under the condition in that the density of the processing fluid L in the processing chamber 11 in the fourth step S4 following the first step S1 is made higher than that in the first step S1, and the density of the processing fluid L in the processing chamber 11 in the first step S1 following the fourth step S4 is made lower than that in the fourth step S4, the etching condition (the etching processing time interval, the concentration of the etching reaction seed in processing fluid L processing temperature, pressure or the like) in the first step S4 and the pressure reduction condition (a pressure reduction rate, a target pressure, the pressure reduction maintains time interval) can be changed at each occasion. However, it is preferable that the difference in the density of the processing fluid L in the processing chamber 11 in the first and fourth steps S1 and S4 is larger.

Further, if the cavity portion has been formed after the repetition has been done to some extent, the supply rate of the processing fluid L in the third step S3 is set such that the cavity portion is not destroyed.

In the second step S2, when it is judged that a predetermined times of the etching processes have completed (Yes), processing proceeds to the fifth step S5.

In the fifth step S5, purge gas g2 such as dry air, nitrogen, or inactive gas is supplied to the processing chamber 11 in the condition in which the pressure has been finally reduced in the just before the first step S1 to return the pressure to an atmospheric pressure. After that, the object S is taken out from the processing chamber 11. Further, if a pre-discharging chamber exists as a preceding chamber to the processing chamber 11, after the pressure in the processing chamber is equalized to that in the pre-discharge chamber, the object S is moved to the pre-discharging chamber and taken out.

Further, the fifth step S5 as mentioned above may be executed before return to the first step S1 after the etching process in the forth step S4 for the final time has completed. In this case, this processing flow is such that the second step S2 is executed between the fourth step S4 and the first step S1. In such a processing flow, the processing fluid L is ejected from the processing chamber 11 by the supply of the purge gas g2 into the processing chamber 11 in the fifth step S5.

If it is desired to completely remove the processing fluid L in the processing chamber 11, a processing flow may be such that, after the fifth step S5, the processing chamber 11 is subject to a cycle purge. In this case, as shown by two-dotted chain lines in the flowchart in FIG. 4, the process goes as follows: after the fifth step S5, a sixth step S6 is further provided to judge whether the cycle purge has been completed. If it is judged that the cycle purge is has not completed in the sixth step S6, a seventh step S7 is further provided to again reduce the pressure in the processing chamber 11. After the seventh step S7, processing returns to the fifth step S5.

According to the etching method as mentioned above, while the etching processes in the fourth step S4 is repeatedly executed, the first step S1 is carried out to reduce the density of processing fluid L by reducing the pressure in the processing chamber 11. As a result, the processing fluid L in the processing chamber 11 is forcedly discharged in the first step S1 and the processing fluid L around the object S, which contributed to etching, is forcedly removed from the vicinity of the object S in the fourth step S4. As a consequence, even though the object S has a cavity portion, a part or almost all of the processing fluid L in the cavity portion can be discharged from the cavity portion.

Further, the third step S3 after the first step S1 like as mentioned above, the processing fluid L is newly supplied into the processing chamber 11, and the density of the processing fluid is increased by increasing the pressure in the processing chamber 11, which results in introduction of the processing fluid containing the new etching reaction seed into the above-mentioned cavity portion. This provides substitution of the processing fluid in the cavity portion.

For example, if in the first step S1, the inside of the processing chamber 11 is discharged to have a pressure that is half of the pressure in the processing chamber in the fourth step S4, the density of the processing fluid in the processing chamber becomes approximately half. Thus, the substitution efficiency of the processing fluid is about 50% when the processing fluid is supplied into the processing chamber in the following third step S3. Further, if the volume of the processing chamber 11 is 1 m$^3$ or less, the etching process under a pressure close to the atmospheric pressure in the forth step S4 provides a pressure reduction approximately from one third to one tenth, which may be provided with a convenient vacuum pump. This provides a substitution efficiency of the processing fluid of from 30% to 90%.

Thus, in the following fourth step S4, the etching process is executed with the processing fluid L containing the etching reaction seed having its activity maintained. Further, repetition of processes from the first step S1 to the fourth step S4 maintains, into the cavity portion of the object S, intermittent supply of the processing fluid containing the etching reaction seed without losing activity in relation to the object. This maintains the etching rate in the cavity portion.

Thus, it is possible to form a cavity portion having a complicated configuration or a cavity portion that is greater than the etching opening by etching the sacrifice layer from the fine etching opening, without remaining etching and with a favorable accuracy in configuration.

This results in improvement of operation characteristics of a micromachine including a three-dimensional structural portion having a cavity portion with a favorable configuration accuracy or a semiconductor device including spatial interconnect with a favorable accuracy in configuration, for example.

Further, according to such an etching method, though a multi-layer interconnect structure is provided over the sacrifice layer, because sufficient removal of the sacrifice layer is provided through a fine, deep etching opening reaching the sacrifice layer, the etching for forming the cavity portion can be carried out near the final process.

Further, because the substitution efficiency of the processing fluid is increased, etching time can be shortened. This shortens an interval for which the outer surface of the object or a surface portion early appearing by etching is exposed to the processing fluid can be reduced, so that corrosion or the effect of etching can be reduced.

Further, during compulsorily discharging the processing fluid, reaction products having low boiling point (having high vapor pressure, volatility) can be removed at the same time.

<Modification 1>

In the example of preferred embodiment as described above, the structure is provided in which, first, the inside of the processing chamber 11 is discharged in the first step S1 to reduce the pressure. However, another structure may be provided in which, without the pressure reduction, supplying the processing fluid 11 into the processing chamber 11 containing the object S provides replacement in the processing chamber 11 with the processing fluid L. In this case, as shown by the chain line in FIG. 4, a flow processing is provided in which the processing is started at the third step S3.

In such a procedure, it is also important to control the discharge from and supply of the processing fluid L to the inside of the processing chamber 11 such that the pressure in the processing chamber in the first step S1 following the fourth step S4 is lower than that in the fourth step S4 following the third step S3 (the density of the processing fluid L is lower), and the pressure in the processing chamber in the fourth step S4 following the first step S1 is higher than that in the first step S1 (the density of the processing fluid L is higher).

Further, if a rate of pressure reduction in the processing chamber 11 in the first step S1 is low, the etching reaction seed of the processing fluid L supplied in the following third step S3 is diluted with the remaining processing fluid L, so that the etching rate in the fourth step S4 decreases. Thus, it is also possible to supply the processing fluid L having a higher concentration of the etching reaction seed in accordance with the pressure reduction rate in the first step S1.

<Modification 2>

As a fluid used as the processing fluid L, a fluid in a supercritical condition (referred to as supercritical fluid) can be used. As a material (supercritical material) providing a supercritical fluid, $N_2$, $CO_2$ or the like is preferably used. In this case, a structure is provided in which the processing chamber 11 is filled with a supercritical fluid by previously controlling the temperature and the pressure, and in the following third step S3, a processing fluid L in which etching reaction seed is dissolved or dispersed is supplied into the processing chamber 11. During this, it is important to keep the inside of the processing chamber 11 in the supercritical atmosphere (pressure, temperature).

Further, in the fifth step S5 after repetition of the first to fourth steps, first, it is important to reduce the pressure in the processing chamber 11 to the atmospheric pressure in which the temperature in the processing chamber 11 is controlled so as to avoid that the supercritical substance in the processing chamber 11 crosses a vapor pressure curve, and then, the temperature is decreased to a temperature close to the room temperature.

As mentioned above, etching carried out with the supercritical fluid can complete the etching without exposure of surfaces of the object to gas-liquid interface. Thus, destruction of very fine structural members due to surface tension is prevented, so that the accuracy in configuration of the structural member formed by the etching can be maintained. Further, if liquid is used as the processing fluid, it is necessary to evaporate the processing fluid or a rinse liquid. Thus, it is difficult to dry the inside through the very fine opening portion. However, such a dry processing is unnecessary.

<Modification 3>

In the example of preferred embodiment mentioned above, the structure was provided in which varying the pressure in the processing chamber 11 in the first and fourth steps S1 and S4 changes the density of the processing fluid L in the processing chamber 11. However, another structure may be provided in which the density of the processing fluid L in the processing chamber 11 is changed by varying the temperature in the processing chamber 11 between the first and fourth steps S1 and S4. In this case, it is possible to control the temperature of the whole of the inside of the processing chamber 11. However, controlling only the temperature of the object S or only the temperature of the neighbor of the objects S is possible to vary the density of the processing fluid L around the object S.

As described above, if the structure is capable of only varying the density of the processing fluid L by the temperature control, a liquid showing a low pressure change can be used as the processing fluid L.

Further, the MODIFICATION1 to MODIFICATION3 are exemplary shown in which a sacrifice layer composed of silicon dioxide is removed by etching with the processing fluid L derived by dispersing hydrofluoric acid as etching reaction seed in water vapor and further another fluid. However, in the present invention, the processing fluid L is not limited and thus, properly selected in accordance with the material forming the sacrifice layer. The processing fluid L is provided by dissolving or dispersing the etching reaction seed in a fluid such as carrier gas, a supercritical fluid, and a liquid or the like if the etching reaction seed (HF, XeF, HCl) is gas or a supercritical fluid, the etching reaction seed can be used as the processing fluid as it is. Further, if the sacrifice layer is made of an organic substance, organic solvent can be used as a processing fluid L or the processing fluid L may be provided by dispersing in fluid powder that can be used as etching reaction seed. However, it is preferable that the processing fluid L has a compressible characteristic (expansion characteristic), and further a processing fluid having a volume change owing to pressure or temperature is preferable because of a higher substitution rate.

Figure 1:
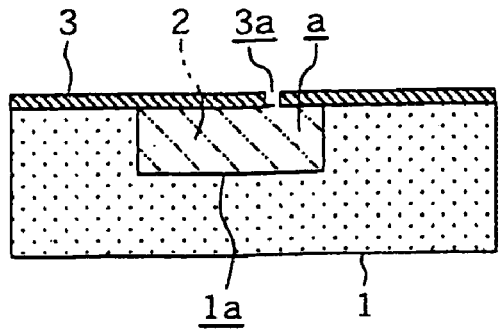
FIG. 1 is a cross section view illustrating an etching method of the prior art.
Figure 2A:
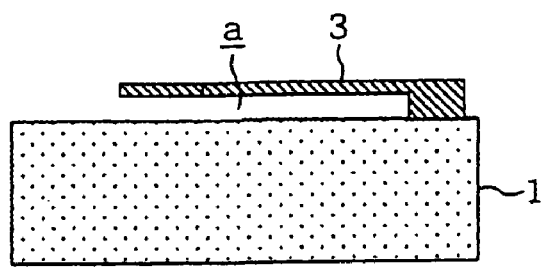
FIGS. 2A to 2C are cross section views describing problems in the etching method of the prior art.
Figure 2B:
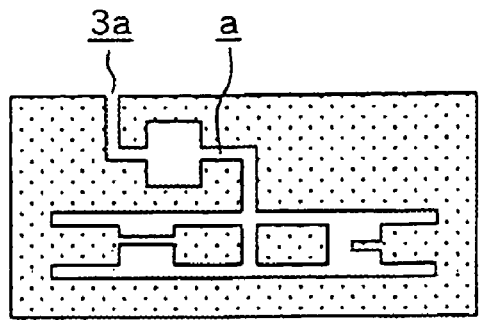
Figure 2C:
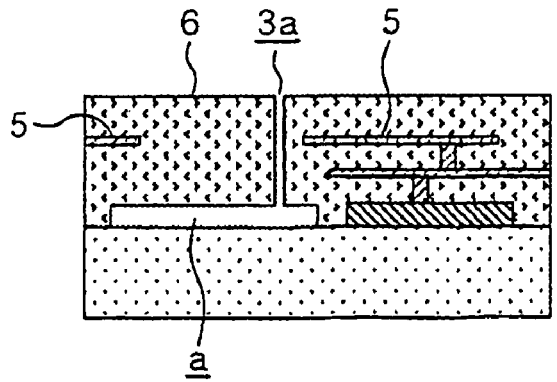

Further, in the repetition of the steps S1 to S4 described with the flow chart in FIG. 1, during a predetermined number of repetitions of the process, another process may be additionally carried out. For example, the repetition process of from the first step S1 to the fourth step S4 is carried out a predetermined number of times advance etching, so that the cavity portion is formed with a certain size. Then, hydrophobic process is carried out on an etching surface. After that, the repetition process of from the first step S1 to the fourth step S4 may be re-started. Such a hydrophobic process enables forming the cavity portion having a large space or a complicated structure in which sticking (so-called sticking; Sticking) on the inner walls of the cavity portion formed to have a certain size is prevented. Further, the additional process carried out during the repetition process of from the first step S1 to the fourth step S4 is not limited to such a hydrophobic process but may be a reforming process for producing a protection film or a reforming film on a part exposed by etching or a process for removing a reaction product. In this case, it may be an additional process that utilizes the pressure reduction (or pressure increase) condition in the first step S1.

Still further, in the repetition process of steps S1 to S4, after removing the target sacrifice layer by etching by carrying out the repetition process the predetermined number of times, a process for etching another subject work can be continuously carried out by changing the processing fluid supplied in the third step S3.

FIRST EXAMPLE OF PREFERRED EMBODIMENT

An object is formed as follows. First, on a surface side of a substrate made of a single crystal silicon, a silicon dioxide film having a thickness of 1 μm is formed as a sacrifice layer, and on this sacrifice layer, a structural member layer made of polycrystalline silicon is formed. After that, a slit-like etching opening having an opening width of 0.5 μm is formed on the structural member layer to expose the sacrifice layer to the bottom of the etching opening.

The sacrifice layer in the object having such a structure is removed by etching by the following procedure (see FIG. 4).

First, the object is placed on the stage in the processing chamber. The pressure of the inside of the processing chamber is reduced to 1 kPa, and then, the reduced pressure is maintained by stopping discharge (first step S1).

Next, the pressure in the processing chamber is increased to 100 kPa by supplying a mixture gas of hydrofluoric acid and water vapor into the processing chamber as a processing fluid, wherein a ratio of the hydrofluoric acid and the water vapor is 3:1 in volume at a room temperature at an atmospheric pressure (the third step S3).

After increase in the pressure in the processing chamber to 100 kPa, maintaining this condition for two minutes provides the etching process for the object (the fourth step S4).

After that, the inside of the processing chamber is discharged for about 30 seconds again to reduce the inside of the processing chamber to 1 kPa (the first step S1).

After reducing the inside pressure of the processing chamber to 1 kPa, without keeping the pressure reduction condition, the mixture of the mixture gas of hydrofluoric acid and water vapor is supplied in the processing chamber to increase the pressure to 100 kPa for about ten seconds (third step S3).

Next, the fourth step S4 is executed similarly, and the first step S1 to the fourth step S4 are repeatedly executed until the fourth step S4 is executed ten times. Thus, the total interval of the etching process in the fourth step S4 is twenty minutes.

After that, the pressure in the processing chamber is reduced to 1 kPa (first step S1), and then increased to about 100 kPa by supplying nitrogen gas into the processing chamber (fifth step S5). Next, the pressure reduction in the processing chamber (the seventh step S7) and the pressure increase (fifth step 5) by supplying nitrogen gas into the processing chamber is repeated to remove the processing fluid, evaporative reaction product, and water from the surface of the object. Further, supplying nitrogen gas into the processing chamber returns the pressure in the processing chamber to the atmospheric pressure (the fifth step S5), and then, the subject processing material is taken out from the processing chamber to complete the process.

As a result, regarding the object, it is confirmed that the etching advances by 32 µm in the lateral direction from the etching opening and thus, the sacrifice layer made of silicon dioxide having a thickness of 1 µm has been removed in this region (See FIG. 3: the first example of preferred embodiment).

On the other hand, as an example for comparison, the etching processing in which the condition of the fourth step S4 is maintained for twenty minutes to a similar object. As a result, it is confirmed that the etching advances only by about 6 µm in the lateral direction from the etching opening and the sacrifice layer made of silicon dioxide having a thickness of 1 µm has been removed only in this region (See FIG. 5: a reference example). Thus, the advantage effect has been confirmed in the etching method in the first example of preferred embodiment to which the present invention is applied.

SECOND EXAMPLE OF PREFERRED EMBODIMENT

A object is formed as follows. First, on a surface side of a substrate made of a single crystal silicon, a hollow portion including a plane configuration having a short side of 100 µm and a long side of 400 µm, and a depth of 1 µm is formed. Next, a silicon dioxide film formed by the CVD method with TEOS gas is buried in the hollow portion. After that, a structural member layer made of polycrystalline silicon on the substrate including the sacrifice layer is formed. Then, in the structural member layer, an etching opening with a slit form having a width of 10 µm along the short side of the hollow portion is formed to expose the sacrifice layer at the bottom of the etching opening.

The object as mentioned above is subject to the etching in the similar procedure to the first example of preferred embodiment.

As a result, the sacrifice layer in the hollow portion having the depth of 1 µm is entirely removed to form the cavity portion having the same configuration.

THIRD EXAMPLE OF PREFERRED EMBODIMENT

In the third example of preferred embodiment, the object similar to the second example of preferred embodiment is etched with a processing fluid provided with a supercritical fluid made of $CO_2$.

First, the object is placed on and fixed to the stage in the processing chamber, the processing chamber is tightly closed, and then, $CO_2$ is supplied into the processing chamber, and the temperature in the processing chamber is increased to provide pressure increase and temperature increase to make the atmosphere in the processing chamber supercritical fluid in condition that $CO_2$ becomes a supercritical condition (31° C., 7.38 MPa or higher). Here, temperature is 35° C. and the pressure is 10 MPa.

With keeping the pressure and the temperature inside the processing chamber constant, a processing fluid provided by mixing hydrofluoric acid with $CO_2$ at 5% in weight and being doped with methanol vapor at about 2% is supplied into the processing chamber. This substitutes $CO_2$ in the processing chamber with the processing fluid. During this, supplying the processing fluid into the processing chamber in which the pressure and the temperature is kept maintains the supercritical fluid atmosphere of $CO_2$ in the processing chamber (the third step S3). Further, Butyrolactone, ethanol, or mixture of them may be used instead of methanol.

Then, the etching process is carried out by maintaining the supply of the processing fluid for three minutes from the start of the supply of the processing fluid into the processing chamber (the fourth step S4).

Next, the pressure in the processing chamber is reduced to 7.5 MPa and the temperature is increased to 60° C. within the range where the supercritical fluid atmosphere of $CO_2$ is maintained to avoid separation of hydrofluoric acid or methanol in the processing chamber (the first step S1).

After that, the processing fluid similar to that described above is supplied into the processing chamber to increase the pressure to 10 MPa at 35° C. in the processing chamber within the range where the supercritical fluid atmosphere of $CO_2$ is maintained to carry out the etching process for three minutes (third step S3, the fourth step S4)

After that, the first step S1 to the fourth step S4 are repeated until the fourth step S4 is executed twenty times.

Then, processing returns to the first step S1 where the pressure in the processing chamber is reduced, and further $CO_2$ containing no etching reaction seed is supplied into the processing chamber where the supercritical fluid atmosphere of $CO_2$ is kept to discharge components of hydrofluoric acid anhydrate and methanol (the fifth step S5). Next, the pressure in the processing chamber is reduced with the temperature being kept higher than the critical temperature to make $CO_2$ in a gaseous condition, and then, the temperature in the processing chamber is reduced to a temperature around a room temperature to take out the object to finish the process after 40%.

As a result, the sacrifice layer in the hollow portion having a plane configuration having the short side of 100 µm and the long side of 400 μm, and the depth of 1 μm is entirely removed, so that a cavity portion having the similar configuration can be formed.

The embodiments and examples described above are only examples of the present invention. It should be noted that the present invention is not restricted only to such embodiments and examples, and various modifications, combinations and sub-combinations, etc., may be made without departing from the scope and spirit of the present invention.

What is claimed is:

1. An etching method comprising:
repetitively executing a first process and a second process, wherein
the first process carries out an etching process of an object by exposing the object to a processing fluid containing an etching reaction seed;
the second process makes a density of said processing fluid containing the etching reaction seed around the object lower than the density of the first process; and
in the first process executed after the second process, said processing fluid containing the etching reaction seed is newly supplied to a processing atmosphere into which the object is placed, and a density of the processing fluid containing the etching reaction seed around the object is made higher than the density of the second process.

2. The etching method as claimed in claim 1, wherein the processing fluid is made of gas or a supercritical fluid, and the density of the processing fluid containing the etching reaction seed in the second process is reduced by making a pressure of the processing atmosphere into which the object is placed lower than that in said first process.

3. The etching method as claimed in claim 1, wherein the density of the processing fluid containing the etching reaction seed around the object in the second process is reduced by heating.

* * * * *